United States Patent [19]

Katumi et al.

[11] 4,434,123
[45] Feb. 28, 1984

[54] METHOD FOR THE PREPARATION OF AN ELECTRIC CONNECTOR

[75] Inventors: Horiko Katumi; Noma Hideyuki, both of Saitama, Japan

[73] Assignee: Shin-Etsu Polymer Co., Ltd., Tokyo, Japan

[21] Appl. No.: 270,898

[22] Filed: Jun. 5, 1981

[30] Foreign Application Priority Data

Jun. 16, 1980 [JP] Japan .................................. 55-81150
Jun. 16, 1980 [JP] Japan .................................. 55-81151

[51] Int. Cl.$^3$ .............................................. B32B 3/26
[52] U.S. Cl. .................................... 264/225; 264/261; 264/272.15; 264/279; 264/299; 264/313
[58] Field of Search .................... 339/17 M, 182, 183; 264/86, 225, 226, 241, 242, 261, 313, 299, 272.15

[56] References Cited

U.S. PATENT DOCUMENTS

| | | | |
|---|---|---|---|
| 3,001,167 | 9/1961 | Chestnutt et al. | 339/183 |
| 3,886,252 | 5/1975 | Eker | 264/225 |
| 3,951,493 | 4/1976 | Kozel et al. | 339/17 M |
| 4,051,296 | 9/1977 | Windecker | 264/225 |

*Primary Examiner*—John A. Parrish

*Attorney, Agent, or Firm*—Hopgood, Calimafde, Kalil, Blaustein & Judlowe

[57] ABSTRACT

The invention provides a novel method for the preparation of an electric connector formed of a core rod of an insulating rubber and a stripe-wise annular zones of a layer formed of an electroconductive paint to exhibit an appearance something like a brandling earthworm. According to the invention, a strip of a plastic film bearing printed stripes of the conductive paint is introduced lengthwise into a tubular mold with the printed surface facing inwardly to take a tubular configuration in direct contact with the inward surface of the tubular mold and the printed surface is brought into contact with the surface of the core rod so as that the striped layer of the conductive paint is transferred and adhesively bonded to the surface of the core rod, each stripe forming substantially closed ring on the core rod. The core rod may be an pre-formed rubber rod or formed by in-mold curing of a liquid prepolymer convertible into a rubber. The thus obtained connector has a smooth surface as a whole with the annular conductive zones and the bare areas of the insulating core rod being flush with each other.

6 Claims, No Drawings

METHOD FOR THE PREPARATION OF AN ELECTRIC CONNECTOR

BACKGROUND OF THE INVENTION

The present invention relates to a method for the preparation of an electric connector. More particularly, the invention relates to a novel and improved method for the preparation of an electric connector of the type formed of a core rod made of an electrically insulating material having elasticity and a plurality of annular zones made of a layer of an electrically conductive material adhesively bonded stripe-wise around the surface of the core rod.

As is well known, many of the modern electronic instruments, e.g. pocketable electronic calculators, electronic watches and the like, are built by use of one or more of tiny electric connectors for making electric connection between parts of the instruments, for example, such as a liquid crystal display and a printed circuit board bearing the circuit for driving the display. Among various types of the electric connectors, there are known connectors of the type formed of a core rod made of an electrically insulating material having elasticity such as an insulating rubbery elastomer and a plurality of annular zones made of a layer of an electrically conductive material bonded stripe-wise around the surface of the core rod, usually, at a regular pitch. The stripe-wise annular zones of the conductive layer above mentioned are formed, for example, by adhesively bonding strips of a metal foil with a very small width around the surface of the elastic core rod or by mounting a plurality of rings of an electroconductive rubber on the core rod, usually, at a regular pitch so as that each of the rings is fixed at the position by the elastic resilience and fastened to the core.

For the electric connectors of the above described types, see, for example, U.S. Pat. Nos. 3,858,958; 3,795,884 and 3,818,414.

The above described conventional methods for manufacturing electric connectors are time-consuming even by very skillful workers so that the connectors manufactured by the method are unavoidably very expensive due to the poor productivity.

SUMMARY OF THE INVENTION

An object of the present invention is therefore to provide a novel and improved method for manufacturing an electric connector of the type formed of a core rod made of an electrically insulating material having elasticity and a plurality of annular zones made of a layer of an electrically conductive material adhesively bonded stripe-wise around the surface of the core rod, according to which the desired connector is manufactured very conveniently and rapidly even by an unskilled worker so that electric connectors of high accuracy can be manufactured with remarkably decreased costs.

The method of the present invention for the preparation of an electric connector of the above described type comprises the steps of (a) introducing a strip of film bearing stripes made of a layer of an electrically conductive material into a tubular mold to be in contact with and to cover the inward surface of the tubular mold with the stripe-wise layer of the electrically conductive material facing inwardly in such a manner that each of the stripes of the layer of the electrically conductive material takes a configuration of a ring substantially closed by itself, (b) contacting the stripe-wise layer of the electrically conductive material borne by the strip of film covering the inward surface of the tubular mold with the surface of a core rod made of an electrically insulating material having elasticity introduced into the tubular mold so that the stripe-wise layer of the electrically conductive material is transferred and adhesively bonded to the surface of the core rod, (c) taking the core rod and the strip of film together out of the tubular mold, and (d) removing the strip of film from the surface of the core rod to leave the stripe-wise annular zones made of the layer of the electrically conductive material as adhesively bonded to the surface of the core rod.

In one embodiment of the inventive method above, a pre-shaped insulating rubber rod is prepared as the core rod, which is lapped lengthwise with the strip of film bearing the stripe-wise electroconductive layer facing inwardly and inserted into and drawn through the tubular mold so as that the electroconductive stripe-wise layer is transferred on to the core rod and adhesively bonded thereto during passage through the tubular mold to form annular electroconductive zones on the core rod.

In another embodiment of the inventive method, the strip of film bearing the stripe-wise electroconductive layer is first inserted alone into the tubular mold in a tubular configuration in direct contact with the inner surface of the tubular mold with the stripe-wise electroconductive layer facing inwardly and a liquid prepolymer capable of being cured or solidified into a rubbery elastomer is poured into the space surrounded by the strip of film in tubular configuarion at an open end thereof and cured or solidified into a solid core rod of the rubbery elastomer during staying in the tubular mold whereby the stripe-wise electroconductive layer is transferred on to and adhesively bonded to the surface of the core rod formed in situ and the core rod and the strip of film are drawn together out of the other end of the tubular mold followed by peeling of the strip of film leaving the stripe-wise annular electroconductive zones on the surface of the core rod.

DETAILED DESCRIPTION OF THE PREFERRED EMBODIMENTS

In any one of the embodiments of the inventive method, it is necessary to prepare a strip of film bearing the stripe-wise layer of an electroconductive material such as an electroconductive paint on one surface thereof. The material of this film may be selected from various kinds of synthetic resins such as polyethylene, polypropylene, polyvinyl chloride, cellulose acetate , polyester, polyimide, polyamide, polyimideamide and the like, among which polyester films are preferred.

The film material must have a surface property susceptible to the formation of the stripe-wise electroconductive layer with, for example, an electroconductive paint although the bonding between the film surface and the electroconductive paint should not be too strong to permit the transfer of the electroconductive layer to the surface of the core rod. The film is also required to be readily peelable from the surface of the core rod after transfer of the electroconductive layer to the surface of the core rod.

The thickness of the strip of film should be small enough in order to facilitate lapping of a core rod of small diameter or insertion into the tubular mold of small inner diameter in a tubular configuration to be in direct contact with the inner surface of the tubular mold. It should be noted, in the case of the in situ formation of the core rod in the tubular mold by use of a liquid prepolymer of a rubbery elastomer, that the film material should have resilience to ensure direct contact with the inner surface of the tubular mold. In this respect, the thickness of the film material should be carefully determined in the range from 5 to 200 $\mu$m in consideration of the flexibility and resilience of the film as well as the diameter of the core rod or inner diameter of the tubular mold. Usually, a smaller diameter of the core rod requires a smaller thickness of the film material.

The stripe-wise layer of the electroconductive material is formed preferably by printing with an electroconductive ink or paint prepared by dispersing a powder of an electroconductive material such as carbon black, graphite, aluminum, nickel, tungsten carbide, copper, silver, gold and the like in a suitable vehicle resin together with other optional additive ingredients such as anti-oxidants, lubricants and the like. Finely chopped electroconductive fibrous materials such as carbon fibers, fibers of tungsten carbide and the like in lengths of, for example, 0.01 to 1 mm are also suitable as an electroconductive dispersant in the ink or paint. It should be noted that the bonding strength between the film material and the stripe-wise layer of the electroconductive ink or paint is not so strong as to prevent the transfer of the stripe-wise layer on to the surface of the core rod.

In the first embodiment of the inventive method, a core rod is prepared in advance with an electrically insulating rubbery elastomer or an insulating plastic resin having sufficient resilience. The polymeric materials suitable for the core rod are exemplified by plasticized polyvinyl chloride resins, polyolefin resins, ethylene-vinylacetate copolymeric resins, organic synthetic rubbers, silicone rubbers and the like though not limited thereto. The material should desirably have a low permanent compression set and, in this respect, silicone rubbers are preferred. The diameter of the core rod is naturally determined according to the desired dimension of the finished connector products and the core rod may be in a unit length or may be formed in a continuous length.

The first step of the method as the first embodiment of the invention is to draw the core rod through a tubular mold as lapped with the strip of the film material bearing the stripe-wise layer of the electroconductive paint. Or, rather, the core rod and the strip of the film material are inserted into the tubular mold side by side and drawn out of the other end of the tubular mold so that the core rod is lapped by the strip of the film as passing through the tubular mold. It is of course optional that the strip of the film material alone is first introduced into the tubular mold to take a tubular configuration and then the core rod is inserted thereinto to be lapped with the strip as a result. The tubular mold is made of a rigid material such as glass, metal and plastic resin and has a smooth inner surface provided, if desired, with a lubricant to facilitate drawing of the core rod lapped with the strip of the film. The diameter of the tubular mold is equal to or slightly smaller than the overall outer diameter of the core rod lapped with the strip of the film so that the strip of the film is tightly pressed on to the surface of the core rod as it passes through the tubular mold together with the core rod. If desired, the open end of the tubular mold, from which the core rod is inserted thereinto, is made funneled to facilitate insertion of the core rod and the strip of the film side by side.

When the core rod is lapped with the strip of the film material in the tubular mold, it is necessary that each of the stripes borne on the strip of the film forms a substantially closed ring by itself on the surface of the core rod. In this connection, the most convenient way is that the strip has a width approximately equal to or slightly smaller than the inner circumferential length of the cross section of the tubular mold and each of the stripes runs in the direction perpendicular to the length of the strip so that, when the strip and the core rod are inserted into the tubular mold in parallel side by side, the core rod is lapped with the rounded strip of the film with each of the stripes forming a substantially closed ring to give an appearance something like a brandling earthworm. Overlapping of the peripheries of the strip should be desirably avoided.

It is of course that the manner for the insertion of the strip of the film material and the core rod is not limited to the above. For example, the strip of the film may have a width narrower than the circumferential length of the cross section of the tubular mold and inserted into the tubular mold as being wound around the core rod spirally so as to cover the whole surface of the core rod. In this case, the running direction of the stripes is correspondingly biased relative to the width-wise direction of the strip so that, when the strip is wound spirally around the core rod, each of the stripes forms an independent closed ring on the surface of the core rod. It is also permissible that each of the closed rings formed on the surface of the core rod is not complete but devoid of a portion to be in a C-wise configuration. When the width of the strip of the film is somewhat larger than the circumferential length of the cross section of the tubular mold, the core rod may be lapped with the strip with an overlapping area along the periphery of the strip. In any case, the strip of the film material should have a sufficient length to cover substantially whole surface of the core rod. For example, the film material of a continuous length which is used to lap the core rod of a continuous length so that the ribbon and the core rod are continuously introduced into and drawn out of the tubular mold to provide a means for continuously manufacturing a continuous length connector which can be subsequently cut into desired product lengths.

The simultaneous introduction of the strip of the film and the core rod is not a difficult matter. For example, the strip and the core rod are temporarily bonded together at the respective ends and the thus bonded ends are inserted into and then drawn out of the other end of the tubular mold so as that the lapping of the core rod with the strip is effected in the mold. It is optional that the core rod is lapped with the strip of the film in advance of the insertion into the tubular mold. The above mentioned spiral winding of the strip of the film around the core rod is easily performed by giving relative rotation to the core rod and the strip of the film.

Since the purpose of the lapping of the core rod with the strip of the film is to have the stripe-wise layer of the electroconductive paint on the film transferred on to the surface of the core rod during drawing of the core rod lapped with the strip of the film through the tubular mold, it is sometimes necessary to provide a small amount of a suitable adhesive agent between the core rod and the strip of the film to facilitate the transfer of the electroconductive layer unless the material of the core rod is an uncured or semi-cured rubber capable of exhibiting sufficient adhesion on the surface without an adhesive agent. The adhesive agent may be of the heat-curable type or a so-called hot-melt type which melts by heating and solidifies by cooling. The adhesive agent should preferably have elasticity upon curing or solidifying and exemplified by those adhesive agents based on epoxy resins, urethane resins, unsaturated polyester resins, vinyl chloride-vinyl acetate copolymeric resins, silicones and various kinds of synthetic rubbers.

The method for providing the adhesive agent on to the surface of the core rod is conventional and need not be described here in detail. Care should be taken in this case that the amount of the adhesive agent is not excessively large to spread out of the seam line of the lapping strip of the film around the core rod and to be smeared on the core rod.

The stripe-wise layer of the electroconductive paint on the lapping strip of the film introduced into the tubular mold together with the core rod is adhesively bonded and transferred to the surface of the core rod during staying in the tubular mold. The adhesive bonding is accelerated by the outer heating means when the adhesive agent is of the heat-curable type while, on the other hand, the adhesive bonding is accelerated by compulsory cooling from outside when the adhesive agent is of the hot-melt type.

The core rod and the strip of the film thus integrated in the tubular mold are then drawn out of the other open end of the tubular mold and, if necessary, subjected to a post-treatment by heating to enhance the adhesive bonding between the stripe-wise layer of the electroconductive paint and the surface of the core rod.

Thereafter, the strip of the film is removed by peeling from the surface of the core rod to leave the electroconductive stripe-wise layer as transferred on the surface of the core rod to be imparted with an appearance something like a brandling earthworm useful as an electric connector.

It is noteworthy that, in this case, adequate control of the amount of the adhesive agent supplied between the core rod and the lapping strip of the film may give a smooth surface of the thus finished earthworm-like connector having the surfaces of the ring-wise stripes and the surfaces of the zones formed of the exposed adhesive agent being coplanar or flush with each other. This is another advantage of the present invention since a connector having such a smooth surface is hardly prepared in the prior art methods.

Following is the description of the second embodiment of the inventive method. The principle of this modified method is the in-mold forming of the core rod within the tubular mold instead of the insertion of a pre-shaped core rod thereinto.

The material and preparation are not repeatedly described here of the strip of the film bearing the stripe-wise layer of the electroconductive paint since they are substantially the same as in the foregoing embodiment with the pre-shaped core rod. In this case, the strip of the film is first introduced alone into the tubular mold to take a tubular configuration in direct contact with the inward surface of the tubular mold. Needless to say, each of the electroconductive stripes on the strip of the film should form a ring substantially closed by itself. The tubular mold may also be substantially the same one as in the foregoing embodiment by use of a pre-shaped core rod.

In this case, no core rod is prepared in advance but the core rod is formed in-mold by curing a thermally curable prepolymer convertible into solid or by solidifying a melt of a polymer by cooling. Thus such a prepolymer or a melt is poured into the space formed by the strip of the film in the tubular configuration in direct contact with the inward surface of the tubular mold by virtue of the resilience thereof. The prepolymer or the melt should be cured or solidified into a solid having elasticity. A variety of such polymeric materials are known in the art, among which room temperature-curable or heat-curable silicone rubber compositions are preferred owing to the low permanent compression set of the cured rubbery material. Thermoplastic resins melting at a relatively low temperature are also suitable such as polyolefins, e.g. polyethylene and polypropylene although care should be taken to avoid adhesive sticking of the molten and then solidified plastic resin to the strip of the film.

When the inventive connector is prepared in the above described manner piece by piece, the tubular mold is held upright with its lower open end stoppered and the liquid prepolymer or molten polymer is poured into the space surrounded by the strip of the film from a nozzle such as an injection syringe or needle to fill the space followed by standing for a sufficient length of time to harden the polymer. If desired, the tubular mold is rotated rapidly around its axis so that the liquid polymer is cured or solidified in a hollow tubular form by the principle of the centrifugal casting. Curing of the heat-curable liquid prepolymer can be accelerated by providing an outer heating means.

When the inventive connector is first shaped in a continuous length and then cut into desired product lengths, on the other hand, the strip of the film or the ribbon bearing the stripe-wise layer of the electroconductive paint is continuously introduced into the tubular mold at the upper open end thereof together with continuous pouring of the liquid polymer with simultaneous drawing of the hardened core rod formed in the mold from the lower end of the tubular mold. The length of the tubular mold and the rate of feeding at the upper open end thereof should be determined so as that the liquid polymer has been sufficiently hardened when it arrives at and drawn out of the lower end of the tubular mold.

The thus formed core rod taken out of the tubular mold as lapped with the strip of the film or the ribbon is then, if necessary, subjected to a post-treatment of heating to complete the curing and the strip of film or the ribbon is removed by peeling from the surface of the core rod leaving the stripe-wise layer of the electroconductive paint transferred and adhesively bonded to the surface of the core rod formed by the in-mold hardening. The surface of the connector obtained by the above described in-mold hardening process is always smooth with the surface of the stripe-wise layer of the electroconductive paint and the bare surface of the core rod being coplanar or flush with each other exhibiting an appearance something like a brandling earthworm.

In the following, the present invention is described in further detail by way of examples.

EXAMPLE 1

There were prepared (1) a ribbon-like polyester film of 25 μm thickness and 6.3 mm width on which stripe-wise layer at a pitch of 1.5 mm and with a width of each of the stripes of 0.75 mm running perpendicularly to the length of the ribbon was formed by printing with an electroconductive paint formulated with sufficient amount of carbon black, (2) a tube of a silicone rubber having an outer diameter of 1.5 mm, an inner diameter of 0.8 mm and a length of 230 mm, (3) a silicone rubber-based adhesive agent admixed with a curing agent and (4) a glass tube having an inner diameter of 2 mm and a length of 200 mm.

In the next place, the adhesive agent was applied uniformly to the surface of the silicone rubber tube, which was inserted into the glass tube together with the ribbon-like polyester film side by side with the stripe-wise layer of the electroconductive paint facing the silicone rubber tube so that, when inserted into the glass tube, the silicone rubber tube was lapped with the polyester film on which each of the stripes of the conductive layer formed a closed ring by itself. The silicone rubber tube was inserted into the glass tube to the other end and the 210 mm portion of the silicone rubber tube was lapped with the polyester film leaving the remaining 20 mm portion unlapped.

The glass tube with the silicone rubber tube and the polyester film inserted therein was heated in a hot air oven at 150° C. for 10 minutes to cure the adhesive agent. After cooling, the silicone rubber tube and the polyester film were pulled out of the glass tube and the polyester film was peeled apart from the silicone rubber tube to find that the stripe-wise layer of the electroconductive paint had been completely transferred and adhesively bonded to the surface of the silicone rubber tube giving an appearance of something like a brandling earthworm. The thus manufactured product was useful as an electric connector.

EXAMPLE 2

The ribbon-like polyester film bearing the stripe-wise layer of the electroconductive paint and the silicone rubber tube were both the same as those used in Example 1 except that each of them was shaped in a continuous length. The glass tube having an inner diameter of 2 mm and a length of 200 mm was also the same as that used in the preceding example but it was provided with a sheath-like heater tube covering a 150 mm portion thereof from an end so as that the covered portion of the glass tube was kept at 200° C.

The side by side insertion of the silicone rubber tube and the ribbon-like polyester film was conducted continuously at a speed of 10 cm/minute with continuous application of the adhesive agent to the outer surface of the silicone rubber tube before the portion entered the glass tube so that the adhesive agent was cured while passing through the heated portion in the glass tube. The silicone rubber tube and the ribbon-like polyester film lapping the rubber tube were drawn together out of the other open end of the glass tube and the polyester film was peeled apart from the silicone rubber tube to find that the stripe-wise layer of the electroconductive paint had been transferred and adhesively bonded to the surface of the silicone rubber tube forming stripe-wise rings of the layer at a pitch of 1.5 mm with a width of each of the stripes of 0.75 mm.

The thus manufactured product of continuous length was useful as an electric connector as cut into unit lengths.

EXAMPLE 3

A ribbon-like polypropylene film of 20 μm thickness and 9.4 mm width was provided with a stripe-wise layer of an electroconductive paint containing a powder of silver at a pitch of 0.6 mm with a width of each of the stripes of 0.3 mm running perpendicularly to the length of the ribbon. A string of polyisoprene rubber of 2.5 mm diameter was coated with a urethane-based adhesive agent admixed with a curing agent and continuously introduced side by side together with the ribbon-like polypropylene film with the stripe-wise layer facing the rubber string into a stainless steel tube of 3 mm inner diameter and 200 mm length at an open end so as that the rubber string was lapped with the polypropylene film as it entered the stainless steel tube.

The rubber string taken out continuously from the other end of the stainless steel tube as lapped with the polypropylene film was heated at 50° C. for 24 hours in an air oven and then the polypropylene film was removed by peeling from the rubber string to find that the stripe-wise layer of the electroconductive paint had been transferred and adhesively bonded to the surface of the rubber string each stripe forming a closed ring therearound.

The thus manufactured continuous length product was useful as an electric connector as cut into unit lengths.

EXAMPLE 4

The same ribbon-like polyester film as in Example 1 was prepared as provided with the stripe-wise layer of the electroconductive paint in just the same manner as in Example 1. This ribbon-like film was bonded at an end thereof to an end of a puller wire of 1.0 mm diameter and 250 mm length with a rapidcure adhesive agent and introduced into a glass tube of 2 mm inner diameter and 200 mm length as guided by the puller wire to leave a 20 mm portion of the ribbon outside the open end of the glass tube.

The puller wire was then separated from the ribbon and taken out of the glass tube. The ribbon like polyester film was contacted with the inward surface of the glass tube by the elastic resilience thereof taking a tubular configuration with the stripe-wise layer of the electroconductive paint facing inwardly.

The glass tube was stoppered at one end with a silicone rubber plug of 2 mm diameter with the tubularly configured polyester film protruded from both open ends of the glass tube. The glass tube was then held upright with the stoppered end at the bottom and a liquid silicone rubber composition curable by heating with admixture of a curing agent was poured into the glass tube at the open end to fill the tube followed by heating at 150° C. for 10 minutes in a hot air oven to cure the silicone rubber composition into a solid silicone rubber rod integrated with the polyester film.

After cooling, the thus integrated body was taken out of the glass tube and the polyester film was peeled apart from the core of the silicone rubber cured in the glass tube to find that the stripe-wise layer of the electroconductive paint was transferred and adhesively bonded to the surface of the silicone rubber rod. The thus obtained product had an earthworm-like appearance and the surface thereof was smooth with the surface of the layer of the electroconductive paint and the exposed portions of the surface of the cured silicone rubber rod being flush with each other. The product was useful as an electric connector.

EXAMPLE 5

A glass tube of 2.0 mm inner diameter and 200 mm length was covered with a tubular heater on the 150 mm portion from one end thereof and this portion was kept at 200° C. by controlling the heater operation. A continuous length ribbon-like film of polyester having the same thickness and width as in Example 1 and provided with a stripe-wise printed layer of the electroconductive paint in just the same manner as in Example 1 was continuously introduced into the glass tube from an open end at a constant velocity of 10 cm/minute so as that the ribbon took a tubular configuration as introduced into the tube in direct contact with the inward surface of the tube.

Simultaneously with the introduction of the ribbon into the glass tube, the same liquid silicone rubber composition as used in Example 4 was poured into the space formed by the tubularly configured ribbon at the open end of the tube along with continuous drawing of the ribbon out of the other open end of the glass tube so as that the silicone rubber composition was taken out as cured solid string after passing through the heated zone lapped with the ribbon of the polyester film. The ribbon of the polyester film was then removed by peeling from the surface of the silicone rubber string to find that the stripe-wise layer of the electroconductive paint had been transferred and adhesively bonded to the surface of the silicone rubber core to give ring-wise electroconductive areas each having a width of 0.75 mm arranged at a pitch of 1.5 mm.

The thus obtained product had smooth surface with the electroconductive and non-conductive areas being flush with each other and was useful as an electric connector as cut into unit product lengths.

We claim:

1. A method for the preparation of an electrical connector formed of a core rod made of an electrically insulating elastic material and a plurality of annular zones made of a layer of an electrically conductive material adhesively bonded stripe-like around the surface of the core rod which comprises the steps of:
   (a) continuously introducing a strip of film bearing releasable strips of a layer of a conductive material into a tubular mold at a first open end contacting and covering the inner surface of the tubular mold with the striped layer of the conductive material facing inwardly in such a manner that each of the stripes of the layer of conductive material takes the configuration of a substantially closed ring with simultaneous continuous discharge of the film out of the second open end;
   (b) contacting the striped layer of conductive material borne by the film covering the inner surface of the tubular mold with the surface of an electrically insulating core of an elastic rubber continuously introduced into the tubular mold at the first open end to fill the space surrounded by the stripe of film with simultaneous continuous discharge at the second open end at such a velocity that the striped layer of the conductive material borne by the film is released onto the surface of the core when the core and the film are discharged out of the tubular mold;
   (c) removing the core rod and the film together as discharged out of the tubular mold; and
   (d) removing the film from the surface of the core to release the striped annular zones of conductive material transferred and adhesively bonded to the surface of the core.

2. The method as claimed in claim 1 further including the step of forming said core from pourable and curable rubber, the curing of said core proceeding in the tubular mold at such a velocity that a fully cured solid core is formed at least when the core reaches the second open end of the tubular mold.

3. The method as claimed in claim 1 wherein the core rod is solid before introduction into the tubular mold.

4. The method as claimed in claim 1 wherein the width of the strip of film is approximately equal to the inner circumferential length of the cross section of the tubular mold and each of the stripes made of a layer of an electrically conductive material borne by the stripe of film runs substantially perpendicularly to the length of the strip.

5. The method as claimed in claim 3 wherein the core rod is made of a silicone rubber.

6. The method as claimed in claim 2 wherein the liquid capable of being solidified into a solid is a liquid silicone composition capable of being cured into a silicone rubber.

* * * * *